(12) United States Patent
Sawada et al.

(10) Patent No.: US 9,184,374 B2
(45) Date of Patent: Nov. 10, 2015

(54) MAGNETORESISTIVE ELEMENT

(71) Applicants: Kazuya Sawada, Morioka (JP); Toshihiko Nagase, Tokyo (JP); Youngmin Eeh, Kawagoe (JP); Koji Ueda, Fukuoka (JP); Daisuke Watanabe, Kai (JP); Masahiko Nakayama, Shimonoseki (JP); Tadashi Kai, Tokyo (JP); Hiroaki Yoda, Kawasaki (JP)

(72) Inventors: Kazuya Sawada, Morioka (JP); Toshihiko Nagase, Tokyo (JP); Youngmin Eeh, Kawagoe (JP); Koji Ueda, Fukuoka (JP); Daisuke Watanabe, Kai (JP); Masahiko Nakayama, Shimonoseki (JP); Tadashi Kai, Tokyo (JP); Hiroaki Yoda, Kawasaki (JP)

(*) Notice: Subject to any disclaimer, the term of this patent is extended or adjusted under 35 U.S.C. 154(b) by 0 days.

(21) Appl. No.: 13/963,762

(22) Filed: Aug. 9, 2013

(65) Prior Publication Data
US 2014/0284742 A1   Sep. 25, 2014

Related U.S. Application Data

(60) Provisional application No. 61/804,573, filed on Mar. 22, 2013.

(51) Int. Cl.
| H01L 29/82 | (2006.01) |
| H01L 43/08 | (2006.01) |
| H01L 43/10 | (2006.01) |

(52) U.S. Cl.
CPC ................. *H01L 43/08* (2013.01); *H01L 43/10* (2013.01)

(58) Field of Classification Search
CPC .. G11C 11/161; G11C 11/16; G11C 11/1675; H01F 10/32; H01L 27/228
USPC .......... 365/145, 158, 171; 257/E21.665, 421, 257/E21.645, 295, 425, 427; 438/3
See application file for complete search history.

(56) References Cited

U.S. PATENT DOCUMENTS

| 5,432,734 | A   * | 7/1995  | Kawano et al. ............... 365/158 |
| 6,633,465 | B2 * | 10/2003 | Hoshiya et al. ............. 360/324.1 |
| 7,596,015 | B2 * | 9/2009  | Kitagawa et al. ............. 365/158 |
| 7,704,613 | B2 * | 4/2010  | Suzuki et al. ............... 428/828.1 |
| 8,107,281 | B2 * | 1/2012  | Kai et al. ....................... 365/158 |
| 8,208,292 | B2 * | 6/2012  | Kai et al. ....................... 365/158 |
| 8,299,552 | B2 * | 10/2012 | Nagase et al. ................ 257/421 |
| 8,520,433 | B1 * | 8/2013  | Kato et al. ..................... 365/171 |
| 8,553,450 | B2 * | 10/2013 | Hosotani et al. .............. 365/158 |
| 8,665,639 | B2 * | 3/2014  | Nagase et al. ................ 365/158 |
| 8,669,628 | B2 * | 3/2014  | Ueda et al. .................... 257/421 |
| 8,670,268 | B2 * | 3/2014  | Nagase et al. ................ 365/158 |
| 8,680,632 | B2 * | 3/2014  | Daibou et al. ................ 257/421 |
| 8,680,633 | B1 * | 3/2014  | Kato et al. ..................... 257/425 |
| 8,705,269 | B2 * | 4/2014  | Nagase et al. ................ 365/158 |

(Continued)

*Primary Examiner* — Telly Green
(74) *Attorney, Agent, or Firm* — Holtz, Holtz, Goodman & Chick PC

(57) ABSTRACT

According to one embodiment, a magnetoresistive element includes first, second and third magnetic layers, and first and second nonmagnetic layers. The third magnetic layer has stack layers including a first stack layer close to the second magnetic layer, and a second stack layer far from the second magnetic layer. Each of the first and second stack layers includes a first layer made of a ferromagnetic material and a second layer made of a nonmagnetic material, and a first ratio of a film thickness of the first layer to that of the second layer in the first stack layer is higher than a second ratio of a film thickness of the first layer to that of the second layer in the second stack layer.

18 Claims, 7 Drawing Sheets

(56) References Cited

U.S. PATENT DOCUMENTS

| | | |
|---|---|---|
| 8,750,029 B2 * | 6/2014 | Kitagawa et al. ............. 365/158 |
| 8,750,030 B2 * | 6/2014 | Ueda et al. .................... 365/158 |
| 2001/0017752 A1 * | 8/2001 | Hoshiya et al. ............ 360/324.1 |
| 2002/0196590 A1 * | 12/2002 | Saito et al. ............... 360/324.11 |
| 2003/0011947 A1 * | 1/2003 | Saito et al. ............... 360/324.11 |
| 2003/0011948 A1 * | 1/2003 | Saito et al. ............... 360/324.11 |
| 2005/0008899 A1 * | 1/2005 | Tachibana et al. ......... 428/694 T |
| 2005/0254179 A1 * | 11/2005 | Miyauchi et al. ........... 360/324.1 |
| 2006/0292401 A1 * | 12/2006 | Suzuki et al. ............. 428/828.1 |
| 2007/0063236 A1 | 3/2007 | Huai et al. |
| 2008/0088980 A1 * | 4/2008 | Kitagawa et al. ............. 360/313 |
| 2009/0079018 A1 * | 3/2009 | Nagase et al. ................ 257/421 |
| 2009/0243008 A1 | 10/2009 | Kitagawa et al. |
| 2010/0020592 A1 * | 1/2010 | Hosotani et al. ............. 365/158 |
| 2010/0230770 A1 * | 9/2010 | Yoshikawa et al. .......... 257/421 |
| 2011/0073970 A1 * | 3/2011 | Kai et al. ..................... 257/421 |
| 2011/0227179 A1 | 9/2011 | Kitagawa et al. |
| 2012/0069640 A1 * | 3/2012 | Nagase et al. ................ 365/158 |
| 2012/0069642 A1 * | 3/2012 | Ueda et al. .................... 365/158 |
| 2012/0088125 A1 * | 4/2012 | Nishiyama et al. ........... 428/828 |
| 2012/0094453 A1 * | 4/2012 | Han et al. ..................... 438/269 |
| 2012/0099369 A1 * | 4/2012 | Kai et al. ...................... 365/158 |
| 2012/0163070 A1 * | 6/2012 | Nagase et al. ................ 365/158 |
| 2012/0241881 A1 * | 9/2012 | Daibou et al. ................ 257/421 |
| 2013/0001713 A1 * | 1/2013 | Ueda et al. .................... 257/421 |
| 2013/0010532 A1 * | 1/2013 | Nagase et al. ................ 365/158 |
| 2013/0037862 A1 * | 2/2013 | Kitagawa et al. ............. 257/252 |
| 2013/0069186 A1 * | 3/2013 | Toko et al. .................... 257/425 |
| 2013/0175644 A1 * | 7/2013 | Horng et al. .................. 257/421 |
| 2013/0187248 A1 * | 7/2013 | Kariyada et al. .............. 257/425 |
| 2013/0240964 A1 * | 9/2013 | Ozeki et al. ................... 257/295 |
| 2013/0250669 A1 * | 9/2013 | Shukh ........................... 365/158 |
| 2013/0288397 A1 * | 10/2013 | Kitagawa et al. ................. 438/3 |
| 2013/0299929 A1 * | 11/2013 | Watanabe et al. ............. 257/421 |
| 2014/0077319 A1 * | 3/2014 | Noma et al. ................... 257/421 |
| 2014/0103469 A1 * | 4/2014 | Jan et al. ....................... 257/421 |

* cited by examiner

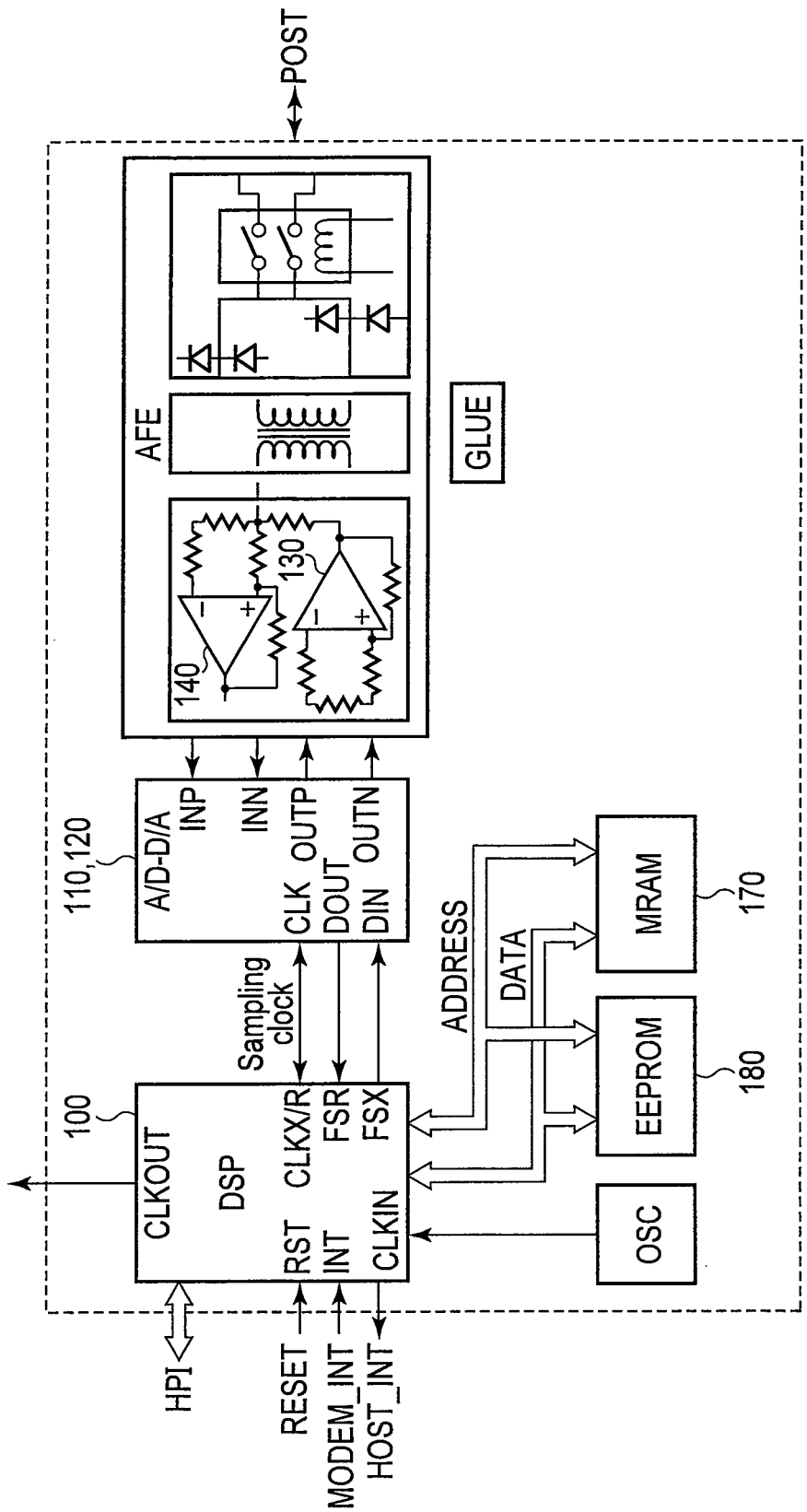
F I G. 7

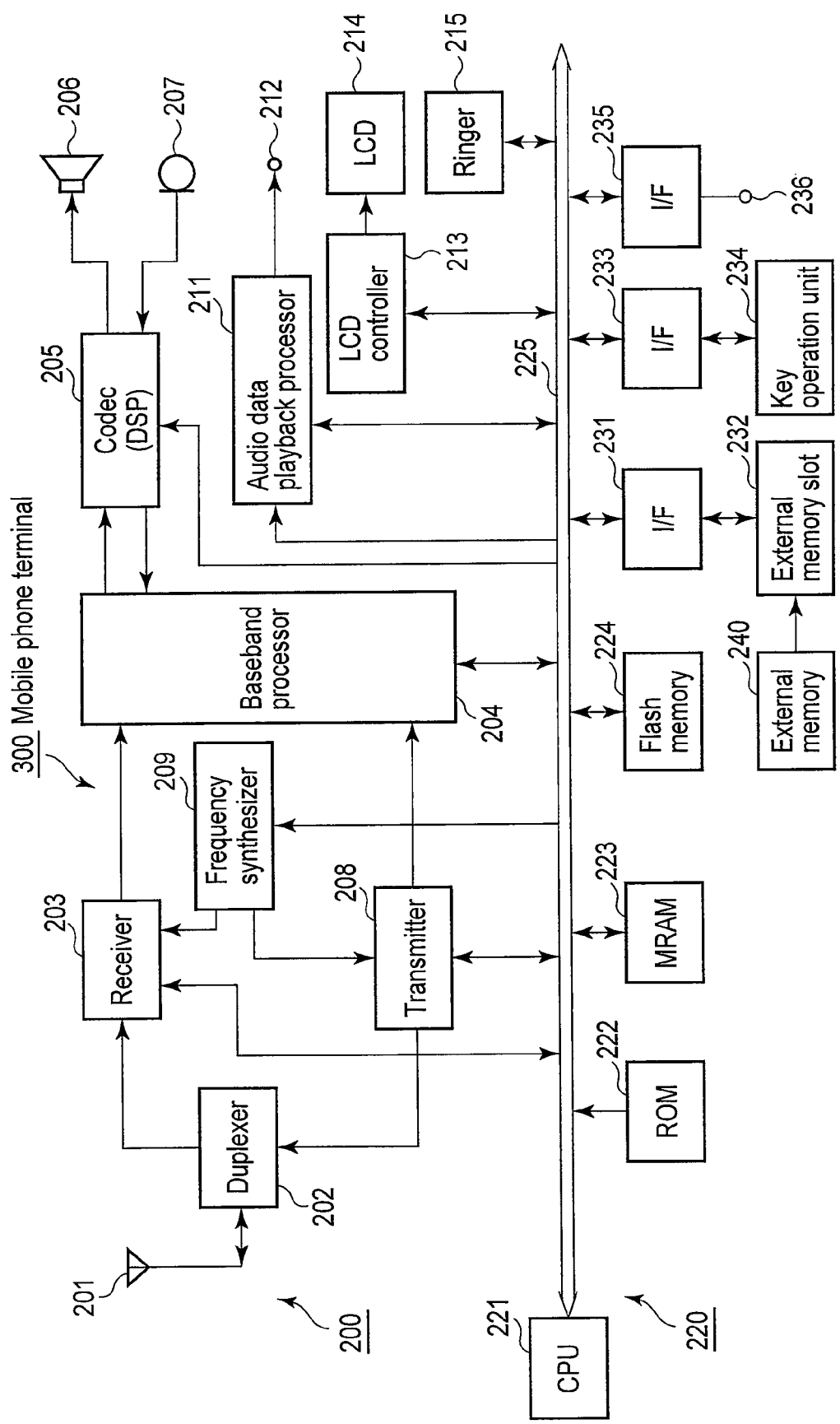
F I G. 8

MAGNETORESISTIVE ELEMENT

CROSS-REFERENCE TO RELATED APPLICATIONS

This application claims the benefit of U.S. Provisional Application No. 61/804,573, filed Mar. 22, 2013, the entire contents of which are incorporated herein by reference.

FIELD

Embodiments described herein relate generally to a magnetoresistive element.

BACKGROUND

Recently, a magnetic random access memory (MRAM) using a spin-polarized electric current has been proposed. This MRAM uses a perpendicular-magnetization magnetic tunnel junction (MTJ) element.

In the perpendicular-magnetization MTJ element, a leakage magnetic field from a reference layer sometimes shifts the hysteresis of a storage layer, and this makes it impossible to write information in a zero-field state. To zero the shift magnetic field, therefore, a shift adjustment layer is formed in the MTJ element. However, the leakage magnetic field from the reference layer increases as the degree of micropatterning increases. This makes it necessary to increase the leakage magnetic field from the shift adjustment layer as micropatterning advances. To increase the leakage magnetic field from the shift adjustment layer, it is necessary to increase the saturation magnetization of the shift adjustment layer, or increase the film thickness of the shift adjustment layer. However, the perpendicularity of the shift adjustment layer becomes difficult to hold if the saturation magnetization is increased, and a pillar shape becomes difficult to process if the film thickness is increased.

BRIEF DESCRIPTION OF THE DRAWINGS

FIG. 7 is a block diagram showing a digital subscriber line (DSL) data path unit of a DSL modem according to application example 1 of an MRAM according to the embodiment; and FIG. 8 is a block diagram showing a mobile phone terminal according to application example 2 of the MRAM according to the embodiment.

DETAILED DESCRIPTION

Figure 1:
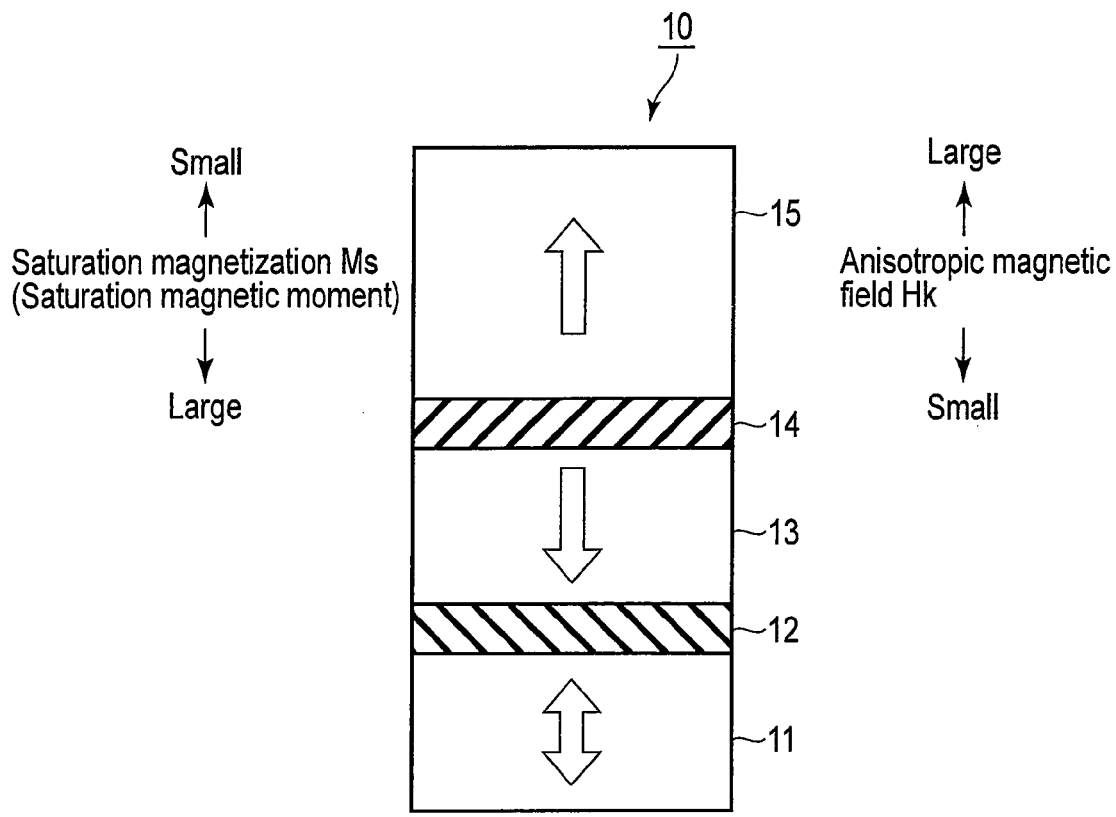
FIG. 1 is a sectional view showing an outline of the structure of an MTJ element according to an embodiment.

In general, according to one embodiment, a magnetoresistive element includes a first magnetic layer, a second magnetic layer, a third magnetic layer, a first nonmagnetic layer formed between the first magnetic layer and the second magnetic layer, and a second nonmagnetic layer formed between the second magnetic layer and the third magnetic layer. The third magnetic layer has a structure in which stack layers are stacked. The stack layers include a first stack layer close to the second magnetic layer, and a second stack layer far from the second magnetic layer. Each of the first stack layer and the second stack layer includes a first layer made of a ferromagnetic material and a second layer made of a nonmagnetic material, and a first ratio of a film thickness of the first layer to that of the second layer in the first stack layer is higher than a second ratio of a film thickness of the first layer to that of the second layer in the second stack layer.

The embodiment will be explained below with reference to the accompanying drawings. In the following explanation, the same reference numerals denote the same parts throughout the drawings.

[1] Structure of MTJ Element

An outline of the structure of an MTJ element (magnetoresistive element) according to an embodiment will be explained below with reference to FIG. 1. The MTJ element of this embodiment is used as a memory element of a spin-transfer torque (STT) MRAM using a spin-polarized electric current.

As shown in FIG. 1, an MTJ element 10 has a structure in which a storage layer (magnetic layer) 11, tunnel barrier layer (nonmagnetic layer) 12, reference layer (magnetic layer) 13, nonmagnetic layer 14, and shift adjustment layer (magnetic layer) 15 are stacked in this order.

In the storage layer 11, the magnetization (or spin) direction is variable and reverses. In the reference layer 13, the magnetization direction is invariable and fixed. The expression "the magnetization direction in the reference layer 13 is invariable" means that the magnetization direction in the reference layer 13 remains unchanged when a magnetization switching current to be used to reverse the magnetization direction in the storage layer 11 is supplied to the reference layer 13. Accordingly, when using a magnetic layer having a large switching current as the reference layer 13 and a magnetic layer having a smaller switching current than the reference layer 13 as the storage layer 11 in the MTJ element 10, it is possible to implement the MTJ element 10 including the storage layer 11 having a variable magnetization direction and the reference layer 13 having an invariable magnetization direction. When causing magnetization reversal by spin-polarized electrons, the switching current is proportional to a damping constant, anisotropic magnetic field Hk, and volume. By appropriately adjusting these factors, therefore, a difference can be produced between the switching currents of the storage layer 11 and reference layer 13.

Each of the storage layer 11 and reference layer 13 has magnetic anisotropy perpendicular to the film planes. The direction of easy magnetization in the storage layer 11 and reference layer 13 is perpendicular to the film planes (this will be called perpendicular magnetization hereinafter). That is, the MTJ element 10 is a so-called perpendicular-magnetization MTJ element 10 in which the magnetization directions in the storage layer 11 and reference layer 13 are perpendicular to the film planes.

As the storage layer 11 and reference layer 13 for implementing the perpendicular-magnetization MTJ element 10, it is possible to use a magnetic material having an $L1_0$ structure or $L1_2$ structure having, as a basic structure, an fct (face-centered tetragonal) structure oriented in the (001) plane with respect to the film in-plane direction. Also, to achieve perpendicular magnetization by using the storage layer 11 and reference layer 13, it is desirable to use a material having a magnetocrystalline anisotropic energy concentration of $5 \times 10^5$ erg/cc or more.

An example of the magnetic material of the storage layer 11 and reference layer 13 is an ordered alloy made of an alloy containing one or more elements selected from iron (Fe), cobalt (Co), nickel (Ni), and manganese (Mn), and one or more elements selected from platinum (Pt), palladium (Pd), rhodium (Rh), gold (Au), and aluminum (Al), and having the $L1_0$ structure as a crystal structure.

As the tunnel barrier layer 12, it is possible to use magnesium oxide (MgO), barium oxide (BaO), calcium oxide (CaO), or aluminum oxide ($AlO_x$) having an NaCl structure as a crystal structure.

The shift adjustment layer 15 has a function of reducing or canceling a magnetic field leaking from the reference layer 13, and reduces (adjusts) the shift of a switching magnetic field of the storage layer 11 caused by this leakage magnetic field. The shift adjustment layer 15 is formed by a magnetic material, and it is possible to use the abovementioned materials of the reference layer 13. In the example shown in FIG. 1, however, the shift adjustment layer 15 is spaced apart from the storage layer 11 than the reference layer 13. To allow the shift adjustment layer 15 to correct the leakage magnetic field to be applied to the storage layer 11, therefore, it is desirable to make the film thickness or saturation magnetization of the shift adjustment layer 15 larger than that of the reference layer 13. For example, when using FePtNi having a saturation magnetization of about 700 emu/cc and a film thickness of about 7 nm as the reference layer 13, it is favorable to use FePt having a saturation magnetization of about 1,000 emu/cc and a film thickness of about 15 nm as the shift adjustment layer 15.

The magnetization directions in the reference layer 13 and shift adjustment layer 15 are set antiparallel to each other. For this purpose, a magnetic coercive force Hc1 of the reference layer 13 and a magnetic coercive force Hc2 of the shift adjustment layer 15 desirably satisfy Hc1>Hc2 or Hc1<Hc2.

The reference layer 13, nonmagnetic layer 14, and shift adjustment layer 15 may also be formed by a synthetic antiferromagnetic (SAF) structure. That is, it is also possible to use, for example, ruthenium (Ru) as the material of the nonmagnetic layer 14, and couple the magnetization directions in the reference layer 13 and shift adjustment layer 15 antiparallel to each other by using the antiferromagnetic coupling.

The nonmagnetic layer 14 has a heat resistance that prevents the mixing of the shift adjustment layer 15 and reference layer 13 in an annealing step, and a function of controlling the crystal orientation when forming the shift adjustment layer 15. As the material of the nonmagnetic layer 14, it is possible to use a nonmagnetic metal such as ruthenium (Ru), silver (Ag), or copper (Cu). If the film thickness of the nonmagnetic layer 14 increases, the distance between the shift adjustment layer 15 and storage layer 11 increases, and as a consequence a magnetic field to be applied from the shift adjustment layer 15 to the storage layer 11 decreases. Therefore, the film thickness of the nonmagnetic layer 14 is desirably, for example, 5 nm or less.

Note that an antiferromagnetic layer (not shown) can also be formed between the nonmagnetic layer 14 and reference layer 13. That is, an antiferromagnetic layer is formed on the reference layer 13, and the nonmagnetic layer 14 is formed on this antiferromagnetic layer. The antiferromagnetic layer has a function of fixing the magnetization of the reference layer 13 in one direction. As the antiferromagnetic layer, it is possible to use, for example, an alloy (for example, FeMn, NiMn, PtMn, PtPdMn, RuMn, OsMn, or IrMn) of manganese (Mn) and iron (Fe), nickel (Ni), platinum (Pt), palladium (Pd), ruthenium (Ru), osmium (Os), or iridium (Ir).

In the MTJ element 10 of this embodiment as described above, the saturation magnetization Ms on that surface of the shift adjustment layer 15, which is close to the reference layer 13, is larger than the saturation magnetization Ms on that surface of the shift adjustment layer 15, which is far from the reference layer 13. For example, the saturation magnetization Ms on that surface of the shift adjustment layer 15, which is close to the reference layer 13, is about 1,200 to 1,500 emu/cc, and the saturation magnetization Ms on that surface of the shift adjustment layer 15, which is far from the reference layer 13, is about 600 to 900 emu/cc. Also, the anisotropic magnetic field Hk on that surface of the shift adjustment layer 15, which is far from the reference layer 13, is larger than the anisotropic magnetic field Hk on that surface of the shift adjustment layer 15, which is close to the reference layer 13. Note that the saturation magnetic moment on that surface of the shift adjustment layer 15, which is close to the reference layer 13, can be larger than the saturation magnetic moment on that surface of the shift adjustment layer 15, which is far from the reference layer 13.

Note that in this embodiment, the shift adjustment layer 15 may also be formed on the side of the storage layer 11. That is, the MTJ element 10 may also have a structure in which the shift adjustment layer 15, nonmagnetic layer 14, storage layer 11, tunnel barrier layer 12, and reference layer 13 are stacked in this order, or a structure in which the shift adjustment layer 15, nonmagnetic layer 14, storage layer 11, tunnel barrier layer 12, reference layer 13, nonmagnetic layer 14, and shift adjustment layer 15 are stacked in this order.

[2] Magnetic Characteristics of Shift Adjustment Layer

The relationship between the saturation magnetization Ms and anisotropic magnetic field Hk of the shift adjustment layer 15 with respect to the distance from the reference layer 13 in the MTJ element 10 of this embodiment will be explained below with reference to FIG. 2.

The saturation magnetization Ms of the shift adjustment layer 15 must be increased in order to prevent the hysteresis of the storage layer 11 from being shifted by a leakage magnetic field from the reference layer 13. On the other hand, it is also necessary to hold the perpendicularity of the magnetization of the shift adjustment layer 15.

Figure 2:
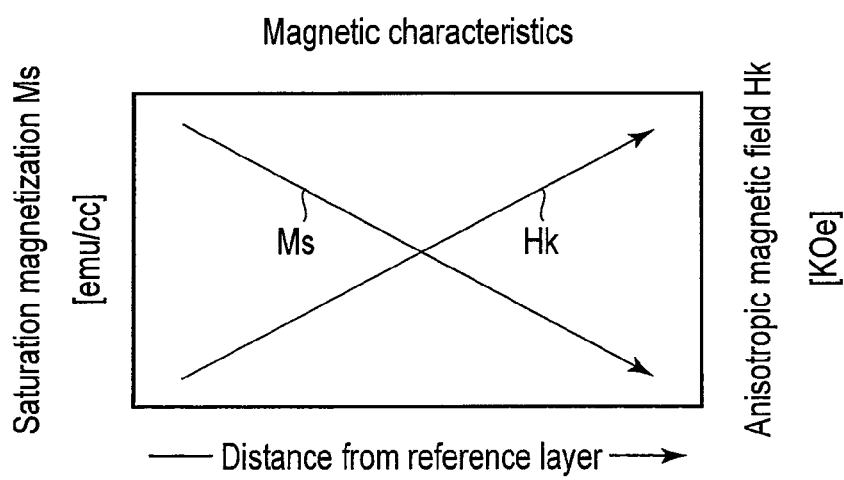
FIG. 2 is a graph showing the magnetic characteristics of the MTJ element according to the embodiment.

As shown in FIG. 2, therefore, the magnetic characteristics of the shift adjustment layer 15 of this embodiment are preferably set so as to increase the saturation magnetization Ms on the surface close to the reference layer 13, which has a large influence on the shift canceling effect, and increase the anisotropic magnetic field Hk on the surface far from the reference layer 13, which has a small influence on the shift canceling effect.

[3] Practical Examples of Shift Adjustment Layer

[3-1] Practical Example 1

Practical example 1 of the shift adjustment layer 15 of this embodiment will be explained below with reference to FIGS. 3A, 3B, 3C, 4, and 5. In practical example 1, the ratio of the film thickness of a ferromagnetic layer 21 to that of a nonmagnetic layer 22 in a plurality of stack layers 20 forming the shift adjustment layer 15 is changed.

Figure 3A:
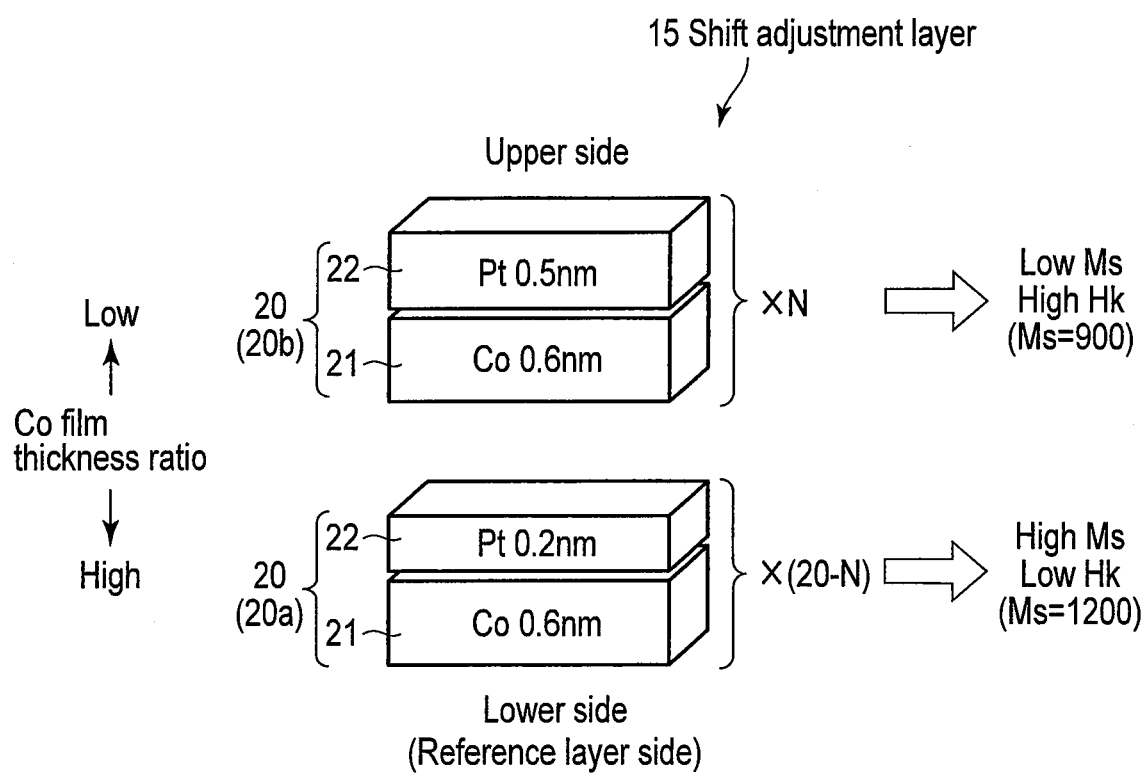
FIGS. 3A, 3B, and 3C are views showing practical example 1 of a shift adjustment layer of the MTJ element according to the embodiment.
Figure 3B:
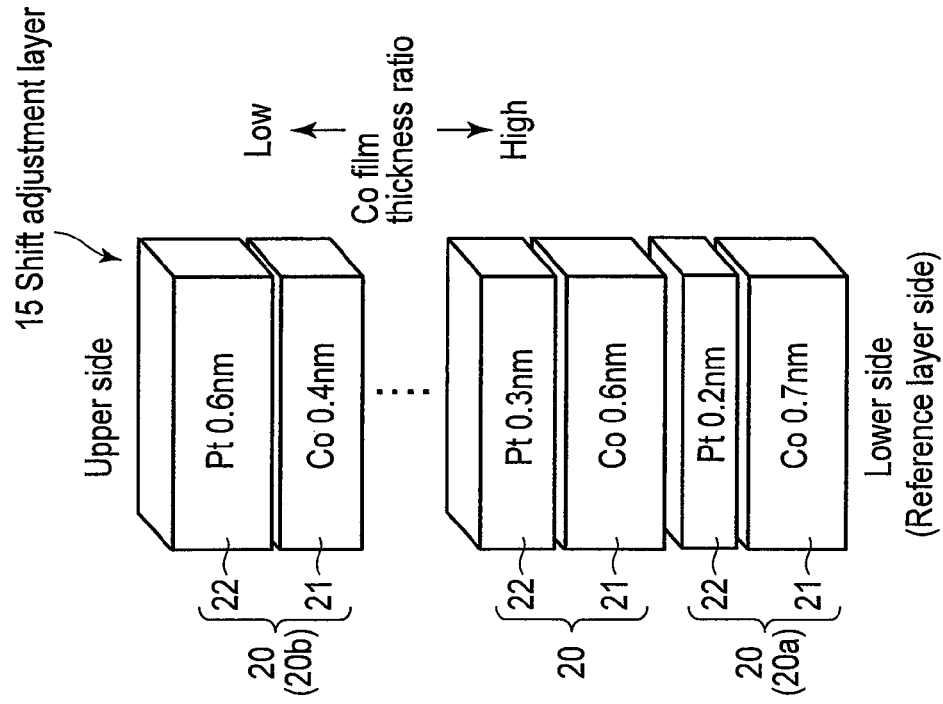
Figure 3C:
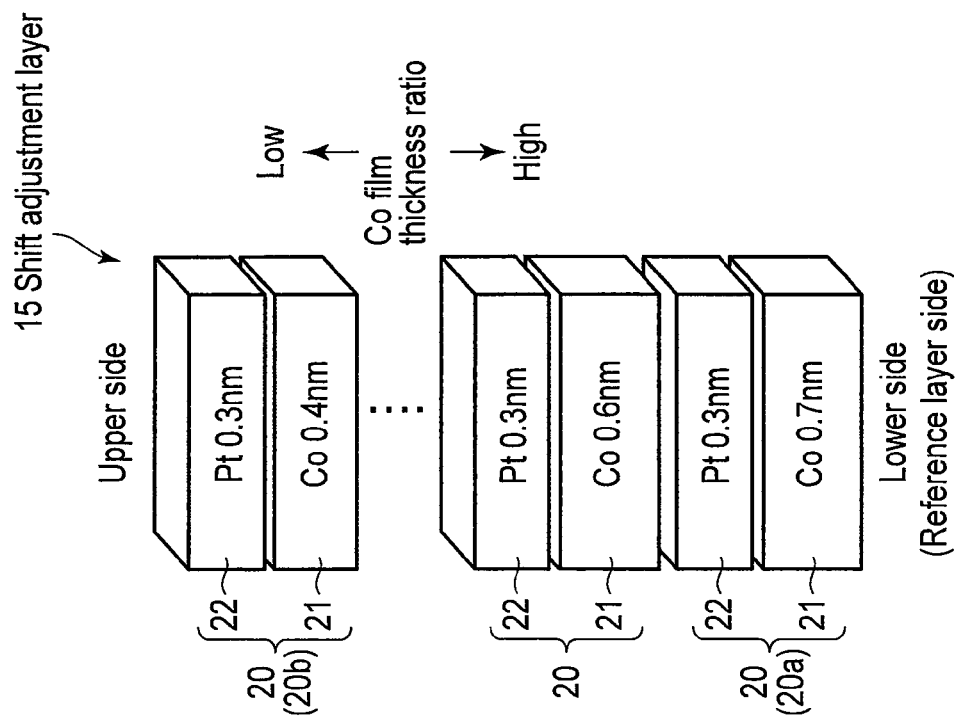

As shown in FIGS. 3A, 3B, and 3C, the shift adjustment layer 15 of practical example 1 has a structure in which the plurality of stack layers 20 are stacked. Each of the plurality of stack layers 20 includes the ferromagnetic layer 21 made of a ferromagnetic material and the nonmagnetic layer 22 made of a nonmagnetic material. In the stack layer 20, the ferromagnetic layer 21 is positioned close to the reference layer 13, and the nonmagnetic layer 22 is positioned far from the reference layer 13. The shift adjustment layer 15 has a structure in which the ferromagnetic layers 21 and nonmagnetic layers 22 are alternately stacked.

In practical example 1 of this embodiment, when a side close to the reference layer 13 is a lower side and a side far from the reference layer 13 is an upper side in the stacking direction of the stack layers 20 of the shift adjustment layer 15, the ratio of the film thickness of the ferromagnetic layer 21 to that of the nonmagnetic layer 22 in a stack layer 20a on the lower side is higher than the ratio of the film thickness of the ferromagnetic layer 21 to that of the nonmagnetic layer 22 in a stack layer 20b on the upper side.

The ferromagnetic layer 21 of the stack layer 20 is a layer that functions as a magnetic layer. The nonmagnetic layer 22 of the stack layer 20 is a layer for increasing the perpendicular anisotropy, and has a crystal structure such as the $L1_0$ structure or $L1_2$ structure having the fct structure oriented in the (001) plane as a basic structure.

As the material of the ferromagnetic layer 21, an alloy containing one or more elements selected from, for example, cobalt (Co), iron (Fe), and nickel (Ni) is used.

As the material of the nonmagnetic layer 22, an alloy containing one or more elements selected from, for example, platinum (Pt), palladium (Pd), terbium (Tb), ruthenium (Ru), chromium (Cr), iridium (Ir), rhodium (Rh), osmium (Os), rhenium (Re), gold (Au), and copper (Cu) is used.

In the shift adjustment layer 15 of practical example 1 shown in FIG. 3A, Co is used as an example of the material of the ferromagnetic layer 21, and Pt is used as an example of the material of the nonmagnetic layer 22. In the stack layer 20a closest to the reference layer 13, the film thickness of the ferromagnetic layer 21 is 0.6 nm, and that of the nonmagnetic layer 22 is 0.2 nm, so the ratio of the film thickness of the ferromagnetic layer 21 to that of the nonmagnetic layer 22 is 3. On the other hand, in the stack layer 20b farthest from the reference layer 13, the film thickness of the ferromagnetic layer 21 is 0.6 nm, and that of the nonmagnetic layer 22 is 0.5 nm, so the ratio of the film thickness of the ferromagnetic layer 21 to that of the nonmagnetic layer 22 is 1.2. Accordingly, the ratio of the film thickness of the ferromagnetic layer 21 to that of the nonmagnetic layer 22 is higher in the stack layer 20a close to the reference layer 13 than in the stack layer 20b far from the reference layer 13.

Also, the shift adjustment layer 15 is formed by stacking the stack layers 20 by, for example, 20 periods. Letting N be the period of the stack layer 20b on the upper side, the period of the stack layer 20a on the lower side is 20-N. When N=10, for example, the shift adjustment layer 15 includes a first stack in which the lower stack layers 20a are stacked by 10 periods, and a second stack in which the upper stack layers 20b are stacked by 10 periods. Accordingly, the stack layers 20a in the first stack have the same ratio of the film thickness of the ferromagnetic layer 21 to that of the nonmagnetic layer 22, and the stack layers 20b in the second stack have the same ratio of the film thickness of the ferromagnetic layer 21 to that of the nonmagnetic layer 22. In this structure, the ratio of the film thickness of the ferromagnetic layer 21 to that of the nonmagnetic layer 22 is higher in the first stack than in the second stack.

Note that as indicated by the shift adjustment layers 15 shown in FIGS. 3B and 3C, the plurality of stack layers 20 in the shift adjustment layer 15 can have three or more values as the ratio of the film thickness of the ferromagnetic layer 21 to that of the nonmagnetic layer 22, or all these stack layers 20 can have different values as this ratio. Even in these structures, the ratio of the film thickness of the ferromagnetic layer 21 to that of the nonmagnetic layer 22 increases toward the reference layer 13.

Furthermore, the saturation magnetization Ms and anisotropic magnetic field of the shift adjustment layer 15 need not continuously change but may change stepwise in accordance with the distance from the reference layer 13.

As shown in FIG. 3A, in the stack layers 20 forming the shift adjustment layer 15, all the ferromagnetic layers 21 can have the same film thickness, and the film thicknesses of the nonmagnetic layers 22 can be decreased toward the reference layer 13. In this structure, the total film thickness as the sum of the film thickness of the ferromagnetic layer 21 and that of the nonmagnetic layer 22 decreases as the position of the stack layer 20 becomes close to the reference layer 13.

As shown in FIG. 3B, in the stack layers 20 forming the shift adjustment layer 15, all the nonmagnetic layers 22 can have the same film thickness, and the film thicknesses of the ferromagnetic layers 21 can be increased toward the reference layer 13. In this structure, the total film thickness as the sum of the film thickness of the ferromagnetic layer 21 and that of the nonmagnetic layer 22 increases as the position of the stack layer 20 becomes close to the reference layer 13.

As shown in FIG. 3C, in the stack layers 20 forming the shift adjustment layer 15, the film thicknesses of the ferromagnetic layers 21 can be increased toward the reference layer 13, and the film thicknesses of the nonmagnetic layers 22 can be decreased toward the reference layer 13. In this structure, the total film thicknesses of the stack layers 20 can increase or decrease toward the reference layer 13, and can also irregularly change.

In the stack layer 20a close to the reference layer 13, the film thickness of the ferromagnetic layer 21 can be either larger or smaller than that of the nonmagnetic layer 22. In the stack layer 20b far from the reference layer 13, the film thickness of the ferromagnetic layer 21 can be either larger or smaller than that of the nonmagnetic layer 22.

Note that when the reference layer 13 is formed by a multilayered film including a ferromagnetic layer and nonmagnetic layer, the ratio of the film thickness of the ferromagnetic layer 21 to that of the nonmagnetic layer 22 in the stack layer 20 of the shift adjustment layer 15 becomes close to the ratio of the film thickness of the ferromagnetic layer to that of the nonmagnetic layer in the multilayered film of the reference layer 13, as the position of the stack layer 20 becomes far from the reference layer 13.

In the shift adjustment layer 15 of practical example 1 as described above, the saturation magnetization Ms can be increased to about 1,200 emu/cc in the stack layer 20a close to the reference layer 13, and a high anisotropic magnetic field Hk can be held while the saturation magnetization Ms is reduced to a 900 emu/cc in the stack layer 20b far from the reference layer 13.

Figure 4:
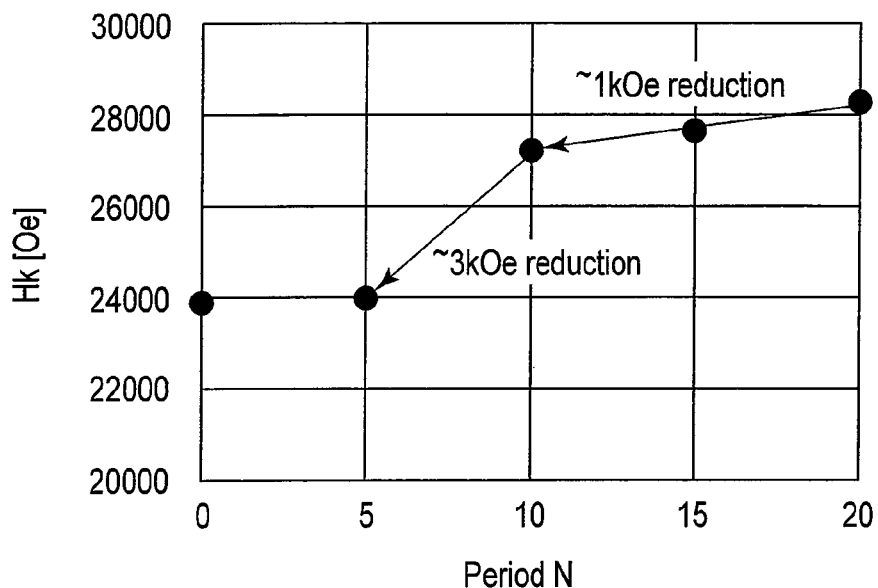
FIG. 4 is a graph showing the relationship between a period N and anisotropic magnetic field Hk in practical example 1 of the shift adjustment layer of the MTJ element according to the embodiment.

For example, as shown in FIG. 4, the anisotropic magnetic field Hk of the shift adjustment layer 15 reduces as the period N of the upper stack layers 20b reduces, i.e., as the period of the lower stack layers 20a increases. For example, the anisotropic magnetic field Hk reduces by 1 kOe when the period N reduces from 20 to 10, and reduces by 3 kOe when the period N reduces from 10 to 5.

Figure 5:
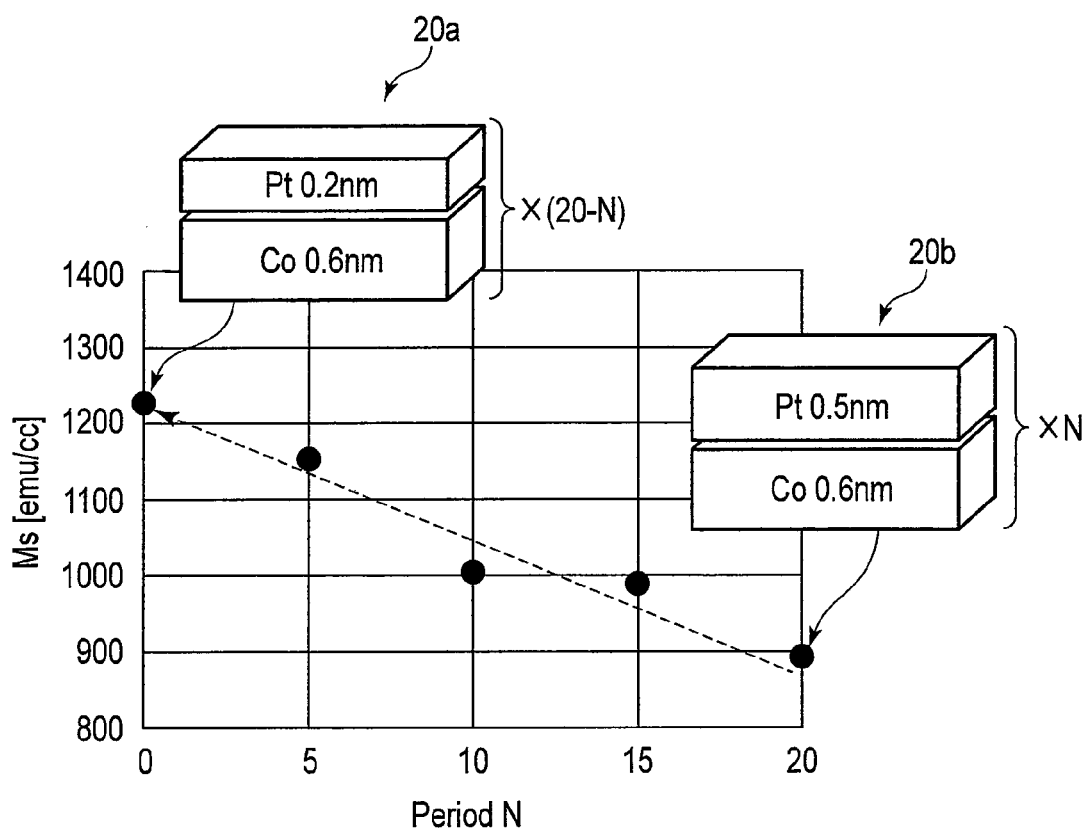
FIG. 5 is a graph showing the relationship between the period N and saturation magnetization Ms in practical example 1 of the shift adjustment layer of the MTJ element according to the embodiment.

For example, as shown in FIG. 5, the saturation magnetization Ms of the shift adjustment layer 15 increases as the period N of the upper stack layers 20b reduces, i.e., as the period of the lower stack layers 20a increases. For example, the saturation magnetization Ms is about 880 emu/cc when the period N is 20, but increases to about 1,220 emu/cc when the period N is 0.

The shift adjustment layer 15 in which N=20 has a structure formed by stacking only the stack layers 20b by 20 periods. The shift adjustment layer 15 in which N=10 has a structure formed by a first stack in which the stack layers 20a are stacked by 10 periods, and a second stack in which the stack layers 20b are stacked by 10 periods. The shift adjustment layer 15 in which N=0 has a structure formed by stacking only the stack layers 20a by 20 periods.

Note that when the stack layers 20 of the shift adjustment layer 15 are formed by 20 periods, the period N is desirably, for example, about 6 to 10.

[3-2] Practical Example 2

Practical example 2 of the shift adjustment layer 15 of this embodiment will be explained below with reference to FIG. 6. In practical example 2, the ratio of the composition of a ferromagnetic material to that of a nonmagnetic material in an alloy layer 30 forming the shift adjustment layer 15 is changed above and below the alloy layer 30.

Figure 6:
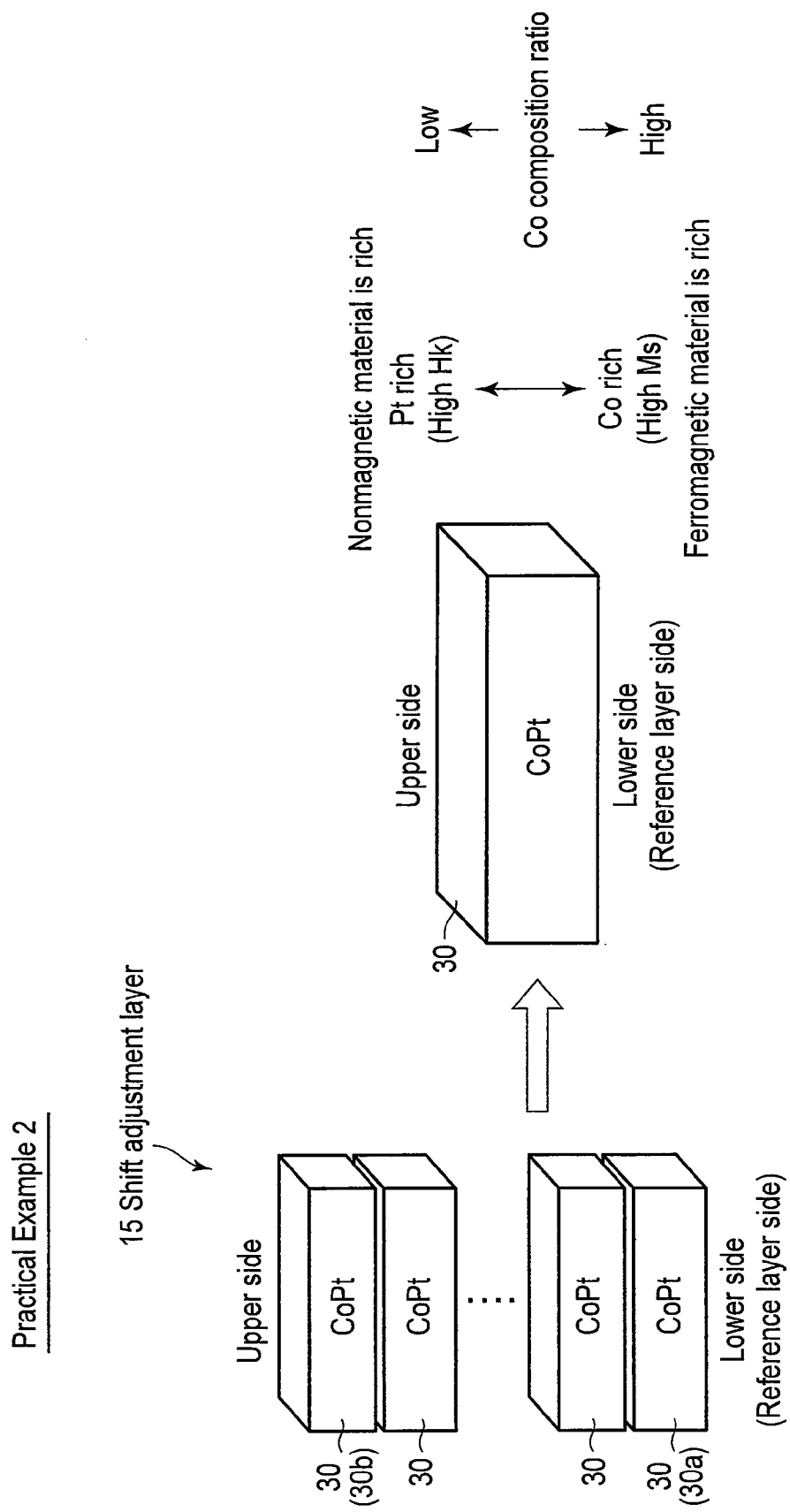
FIG. 6 is a view showing practical example 2 of the shift adjustment layer of the MTJ element according to the embodiment.

As shown in FIG. 6, the shift adjustment layer 15 of practical example 2 has a structure in which a plurality of alloy layers 30 are stacked. Each of the plurality of alloy layers 30 is formed by an alloy containing a ferromagnetic material and nonmagnetic material.

In practical example 2 of this embodiment, when a side close to the reference layer 13 is a lower side and a side far from the reference layer 13 is an upper side in the stacking (film thickness) direction of the alloy layers 30 of the shift adjustment layer 15, the ratio of the composition of the ferromagnetic material to that of the nonmagnetic material on the lower side of each alloy layer 30 is higher than the ratio of the composition of the ferromagnetic material to that of the nonmagnetic material on the upper side of the alloy layer 30. That is, the alloy layer 30 has the concentration distributions of the ferromagnetic material and nonmagnetic material in the film thickness direction: the concentration of the ferromagnetic material in the alloy layer 30 is higher on the lower side than on the upper side, and the concentration of the nonmagnetic material in the alloy layer 30 is higher on the upper side than on the lower side.

As the ferromagnetic material and nonmagnetic material of the alloy layer 30, it is possible to use the material of the ferromagnetic layer 21 and the material of the nonmagnetic layer 22 described in practical example 1. Examples of the alloy material of the alloy layer 30 are Co-based alloys such as CoPt, CoPd, CoTb, CoRu, CoCr, CoIr, CoRh, CoOs, CoRe, CoAu, and CoCu, Fe-based alloys such as FePt, FePd, FeTb, FeRu, FeCr, FeIr, FeRh, FeOs, FeRe, FeAu, and FeCu, Ni-based alloys such as NiCr, NiIr, NiRh, NiOs, NiRe, NiAu, and NiCu, and Mn-based alloys such as MnCr, MnIr, MnRh, MhOs, MnRe, MnAu, and MnCu.

In the shift adjustment layer 15 of practical example 2 shown in FIG. 6, CoPt as an alloy containing Co as a ferromagnetic material and Pt as a nonmagnetic material is used as an example of the alloy layer 30. In this structure, Co is rich on the surface (lower side) of the alloy layer 30, which is close to the reference layer 13, and Pt is rich on the surface (upper side) of the alloy layer 30, which is far from the reference layer 13. Accordingly, the ratio of the composition of the ferromagnetic material (Co) to that of the nonmagnetic material (Pt) on the lower side of the alloy layer 30 is higher than the ratio of the composition of the ferromagnetic material (Co) to that of the nonmagnetic material (Pt) on the upper side of the alloy layer 30. This makes it possible to increase the saturation magnetization Ms on the lower side of the alloy layer 30, and increase the anisotropic magnetic field Hk on the upper side of the alloy layer 30.

In practical example 2, the concentration distributions of the ferromagnetic material in the plurality of alloy layers 30 forming the shift adjustment layer 15 can be the same or different. In the latter case, the concentration of the ferromagnetic material on the lower side of an alloy layer 30a of the shift adjustment layer 15, which is close to the reference layer 13, is desirably higher than that of the ferromagnetic material on the lower side of an alloy layer 30b of the shift adjustment layer 15, which is far from the reference layer 13.

In practical example 2, the film thicknesses of the alloy layers 30 of the shift adjustment layer 15 can be the same or different. In the latter case, the film thicknesses of the alloy layers 30 of the shift adjustment layer 15 can increase or decrease toward the reference layer 13, and can also irregularly change.

In practical example 2, the alloys forming the alloy layers 30 of the shift adjustment layer 15 can be made of the same material or different materials.

Note that when the reference layer 13 is formed by an alloy film including a ferromagnetic material and nonmagnetic material, the ratio of the composition of the ferromagnetic material to that of the nonmagnetic material in the alloy layer 30 of the shift adjustment layer 15 becomes close to the ratio of the composition of the ferromagnetic material to that of the nonmagnetic material in the alloy film of the reference layer 13, as the position of the alloy layer 30 becomes far from the reference layer 13.

Also, the shift adjustment layer 15 is not limited to the multilayered structure in which the plurality of alloy layers 30 are stacked, and can also be a single-layered structure including one alloy layer 30.

[4] Application Examples of MRAM

The MRAM including the MTJ element 10 shown in the third embodiment is applicable to various apparatuses. Application examples 1 and 2 of the MRAM will be explained below.

[4-1] Application Example 1

FIG. 7 shows a DSL data path module of a digital subscriber line (DSL) modem. The modem includes a programmable digital signal processor (DSP) 100, an analog-to-digital converter 110, a digital-to-analog converter 120, a transmission driver 130 and a receiver amplifier 140.

In FIG. 7, a band-pass filter is omitted, and an MRAM 170 of this embodiment and an EEPROM 180 are shown in place of the band-pass filter. The MRAM 170 and the EEPROM 180 are built in as various optional memories for holding a line code program (for selecting and operating a modem in accordance with coded subscriber line information and transmission conditions [line code: QAM, CAP, RSK, FM, AM, PAM, DWMT, etc.]) executed by the DSP.

According to application example 1, two memories, that is, the MRAM 170 and the EEPROM 180 are used as a memory for holding a line code program; however, the EEPROM 180 may be replaced with an MRAM, i.e., so that only the MRAM is used instead of using two memories.

[4-2] Application Example 2

FIG. 8 shows another application example, that is, a mobile phone terminal 300. A communication unit 200 for realizing a communication function includes a transmission/reception antenna 201, a duplexer 202, a receiver 203, and a baseband processor 204. The communication unit 200 further includes a DSP 205 used as an audio codec, a speaker (receiver) 206, a microphone (mouthpiece) 207, a transmitter 208, and a frequency synthesizer 209.

The mobile phone terminal 300 is further provided with a controller 220 for controlling various components of the mobile phone terminal 300. The controller 220 is a microcomputer, which is configured so that a CPU 221, a ROM 222, an MRAM 223 of this embodiment and a flash memory 224 are connected via a bus 225. The foregoing ROM 222 is previously stored with programs executed by the CPU 221 and necessary data such as display fonts.

The MRAM 223 is mainly used as a work area. Specifically, the MRAM 223 is used in the case of storing data during computing when the CPU 221 executes a program as the need arises, and temporarily storing exchange data between the controller 220 and various components. The flash memory 224 stores previous setting conditions even if the power of the mobile phone terminal 300 is turned off. At the next power-on, the flash memory 224 stores setting parameters when the setting as above is used. In this way, even if the power of the mobile phone terminal 300 is turned off, the stored setting parameters are not lost.

The mobile phone terminal 300 is further provided with an audio reproduction processor 211, an external output terminal 212, a liquid crystal display (LCD) controller 213, a display LCD 214 and a ringer 215 for giving a call sound. The audio reproduction processor 211 reproduces audio information input to the mobile phone terminal 300 (or audio information stored in an external memory 240 described latter). The reproduced audio information is transmitted to a headphone and a mobile speaker via the external output terminal 212. As described above, if the audio reproduction processor 211 is provided, audio information is reproducible. The LCD controller 213 receives display information from the CPU 221 via the bus 225, and converts it to LCD control information for controlling the LCD 214 to drive the LCD 214 for display.

The mobile phone terminal 300 is further provided with interface circuits 231, 233, and 235, an external memory 240, an external memory slot 232, a key operation panel 234 and an external input/output terminal 236. The foregoing external memory slot 232 is inserted with the external memory 240 such as a memory card. The external memory slot 232 is connected to the bus 225 via the interface circuit 231. As described above, the mobile phone terminal 300 is provided with the slot 232, and thereby, internal information of the terminal 300 is written to the external memory 240, or information (for example, audio information) stored in the external memory 240 is input to the terminal 300.

The key operation panel 234 is connected to the bus 225 via the interface circuit 233. Key input information input from the key operation panel 234 is transmitted to the CPU 221, for example. The external input/output terminal 236 is connected to the bus 225 via the interface circuit 233. Thus, the external input/output terminal 236 functions as a terminal, which inputs various information externally to the mobile phone terminal 300, or outputs information externally from the mobile phone terminal 300.

According to this application example 2, the foregoing ROM 222, MRAM 223 and flash memory 224 are used. In this case, the flash memory 224 may be replaced with an MRAM, and further, the ROM 222 may be replaced with an MRAM.

[5] Effects

In this embodiment, the saturation magnetization Ms and saturation magnetic moment of the shift adjustment layer 15 are increased not on the surface far from the reference layer 13 but on the surface close to it, and the anisotropic magnetic field Hk of the shift adjustment layer 15 is increased not on the surface close to the reference layer 13 but on the surface far from it.

By increasing the saturation magnetization Ms on that surface of the shift adjustment layer 15, which is close to the reference layer 13, it is possible to cancel a leakage magnetic field from the reference layer 13 by a leakage magnetic field from the shift adjustment layer 15, and prevent the shift of the hysteresis of the storage layer 11. Accordingly, the effect of canceling the shift of the switching magnetic field of the storage layer 11 can be improved without increasing the film thickness of the shift adjustment layer 15. Consequently, it is possible to reduce variations in switching magnetic field of the storage layer 11 between the MTJ elements 10.

By increasing the anisotropic magnetic field Hk on that surface of the shift adjustment layer 15, which is far from the reference layer 13, a high perpendicular anisotropy of the shift adjustment layer 15 can be maintained even when the saturation magnetization Ms is increased on that surface of the shift adjustment layer 15, which is close to the reference layer 13.

As has been described above, the shift adjustment layer 15 of this embodiment can improve the effect of canceling the shift of the switching magnetic field, and hold a high perpendicular anisotropy.

Each of above described MTJ structures can be introduced as MTJ elements of memory cells. Memory cells, memory cell arrays and memory devices are disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetoresistive element comprising:
a first magnetic layer;
a second magnetic layer;
a third magnetic layer;
a first nonmagnetic layer formed between the first magnetic layer and the second magnetic layer; and
a second nonmagnetic layer formed between the second magnetic layer and the third magnetic layer,
wherein:
the third magnetic layer has a structure in which stack layers are stacked, the stack layers include a first stack layer close to the second magnetic layer, and a second stack layer which is farther from the second magnetic layer than the first magnetic layer is, each of the first stack layer and the second stack layer includes a first layer made of a ferromagnetic material and a second layer made of a nonmagnetic material, a first ratio of a film thickness of the first layer to a film thickness of the second layer in the first stack layer is higher than a second ratio of a film thickness of the first layer to a film thickness of the second layer in the second stack layer, a saturation magnetization of the first stack layer is larger than a saturation magnetization of the second stack layer, and an anisotropic magnetic field of the second stack layer is larger than an anisotropic magnetic field of the first stack layer.

2. The element according to claim 1, wherein the first layer is positioned on a side close to the second magnetic layer, and the second layer is positioned on a side far from the second magnetic layer.

3. The element according to claim 1, wherein the first layers and the second layers are alternately arranged in the third magnetic layer.

4. The element according to claim 1, wherein:
the third magnetic layer includes a first stack in which a plurality of the first stack layers are stacked, and a second stack in which a plurality of the second stack layers are stacked,
the first stack layers in the first stack have a same first ratio, and
the second stack layers in the second stack have a same second ratio.

5. The element according to claim 1, wherein:
the first layer of the first stack layer and the first layer of the second stack layer have a same film thickness, and
a film thickness of the second layer of the first stack layer is smaller than a film thickness of the second layer of the second stack layer.

6. The element according to claim 1, wherein:
a film thickness of the first layer of the first stack layer is larger than a film thickness of the first layer of the second stack layer, and
the second layer of the first stack layer and the second layer of the second stack layer have a same film thickness.

7. The element according to claim 1, wherein:
a film thickness of the first layer of the first stack layer is larger than a film thickness of the first layer of the second stack layer, and
a film thickness of the second layer of the first stack layer is smaller than a film thickness of the second layer of the second stack layer.

8. The element according to claim 1, wherein:
a film thickness of the first layer is larger than a film thickness of the second layer in the first stack layer, and
a film thickness of the first layer is smaller than a film thickness of the second layer in the second stack layer.

9. The element according to claim 1, wherein the first magnetic layer is a storage layer, and the second magnetic layer is a reference layer.

10. The element according to claim 1, wherein:
the ferromagnetic material is an alloy containing not less than one element selected from the group consisting of cobalt (Co), iron (Fe), and nickel (Ni), and
the nonmagnetic material is an alloy containing not less than one element selected from the group consisting of platinum (Pt), palladium (Pd), terbium (Tb), ruthenium (Ru), chromium (Cr), iridium (Ir), rhodium (Rh), osmium (Os), rhenium (Re), gold (Au), and copper (Cu).

11. A magnetoresistive element comprising:
a first magnetic layer;
a second magnetic layer;
a third magnetic layer;
a first nonmagnetic layer formed between the first magnetic layer and the second magnetic layer; and
a second nonmagnetic layer formed between the second magnetic layer and the third magnetic layer,
wherein:
the third magnetic layer has a structure in which stack layers are stacked,
each of the stack layers includes a first layer made of a ferromagnetic material and a second layer made of a nonmagnetic material,
the third magnetic layer has a first surface close to the second magnetic layer and a second surface which is farther from the second magnetic layer than the first surface is,
a ratio of a composition of the ferromagnetic material to a composition of the nonmagnetic material on the first surface of the third magnetic layer is higher than a ratio of the composition of the ferromagnetic material to the composition of the nonmagnetic material on the second surface of the third magnetic layer,
a saturation magnetization on the first surface of the third magnetic layer is larger than a saturation magnetization on the second surface of the third magnetic layer, and
an anisotropic magnetic field on the second surface of the third magnetic layer is larger than an anisotropic magnetic field on the first surface of the third magnetic layer.

12. The element according to claim 11, wherein the first layer is an alloy layer made of an alloy containing the ferromagnetic material and the nonmagnetic material.

13. The element according to claim 11, wherein a concentration of the ferromagnetic material in the third magnetic layer is higher on the first surface than on the second surface, and a concentration of the nonmagnetic material in the third magnetic layer is higher on the second surface than on the first surface.

14. The element according to claim 11, wherein a concentration of the ferromagnetic material on a surface of the stack layer on a side of the third magnetic layer, which is close to the second magnetic layer, is higher than a concentration of the ferromagnetic material on a surface of the stack layer on a side of the third magnetic layer, which is far from the second magnetic layer.

15. The element according to claim 11, wherein the first magnetic layer is a storage layer, and the second magnetic layer is a reference layer.

16. The element according to claim 11, wherein:
the ferromagnetic material is an alloy containing not less than one element selected from the group consisting of cobalt (Co), iron (Fe), and nickel (Ni), and
the nonmagnetic material is an alloy containing not less than one element selected from the group consisting of platinum (Pt), palladium (Pd), terbium (Tb), ruthenium (Ru), chromium (Cr), iridium (Ir), rhodium (Rh), osmium (Os), rhenium (Re), gold (Au), and copper (Cu).

17. A magnetoresistive element comprising:
a first magnetic layer;
a second magnetic layer;
a third magnetic layer;
a first nonmagnetic layer formed between the first magnetic layer and the second magnetic layer; and a second nonmagnetic layer formed between the second magnetic layer and the third magnetic layer, wherein:

the third magnetic layer has a structure in which stack layers are stacked, each of the stack layers includes a first layer made of a ferromagnetic material and a second layer made of a nonmagnetic material, the third magnetic layer has a first surface close to the second magnetic layer and a second surface which is farther from the second magnetic layer than the first surface is, a saturation magnetization on the first surface of the third magnetic layer is larger than a saturation magnetization on the second surface of the third magnetic layer, and an anisotropic magnetic field on the second surface of the third magnetic layer is larger than an anisotropic magnetic field on the first surface of the third magnetic layer.

18. The element according to claim 17, wherein a saturation magnetic moment on the first surface of the third magnetic layer is larger than a saturation magnetic moment on the second surface of the third magnetic layer.

* * * * *